United States Patent [19]

Ito et al.

[11] 4,157,504
[45] Jun. 5, 1979

[54] VHF TELEVISION TUNER WITH EASY/FLEXIBLE ACCESS

[75] Inventors: Katsuo Ito; Bunjiro Murata, both of Kanazawa; Yoji Maeda, Ishikawa; Kazunori Yoshimura; Eiichi Hibino, both of Kanazawa, all of Japan

[73] Assignee: Murata Manufacturing Co., Ltd., Japan

[21] Appl. No.: 780,109

[22] Filed: Mar. 22, 1977

[30] Foreign Application Priority Data

Jan. 18, 1977 [JP] Japan .............................. 52-5170[U]
Jan. 18, 1977 [JP] Japan .............................. 52-5171[U]

[51] Int. Cl.$^2$ ................................................ H04B 1/06
[52] U.S. Cl. ................................... 325/464; 325/352; 358/191; 358/254; 334/75; 334/85
[58] Field of Search .............. 325/352, 353, 360, 452, 325/457, 464, 468; 358/191, 254; 334/75, 76, 85

[56] References Cited

U.S. PATENT DOCUMENTS 3,622,700 11/1971 Goetz, Jr. ............................ 358/254

OTHER PUBLICATIONS

PTS Electronics, Inc., Catalog No. 3, 1/1973, p. 30.
Textbook on "Television Servicing" by Buchsbaum, 1954, pp. 105-117, 214-228.

*Primary Examiner*—Robert L. Griffin
*Assistant Examiner*—Jin F. Ng
*Attorney, Agent, or Firm*—Staas & Halsey

[57] ABSTRACT

A VHF television tuner for selection of a broadcasting television signal through mechanical switching selection of inductance coils, comprising; a tuner casing; a mechanical channel selection switch arrangement provided in said casing and including a rotatably mounted channel selection shaft for selection of inductance coils by rotation of said shaft; a radio frequency amplifier operatively coupled to the selected inductance coils for selectively amplifying a desired radio frequency signal; a local oscillator operatively coupled to said selected inductance coils for providing a local oscillation frequency signal, the frequency of which is different by a given frequency difference from said selectively amplified radio frequency signal; a mixer responsive to the radio frequency signal from said radio frequency amplifier and the local oscillation frequency signal from said local oscillator for providing an intermediate frequency signal; and an intermediate frequency tuned circuit for selectively withdrawing said intermediate frequency signal, said intermediate frequency tuned circuit comprising an intermediate frequency transformer, said intermediate frequency transformer comprising an intermediate frequency coil wound around a bobbin having a given axis and a magnetic core threadably inserted in said bobbin for adjustment of the inductance value of said intermediate frequency coil by rotation of said magnetic core about said axis of said bobbin, said intermediate frequency transformer being provided in said casing such that the axis of said bobbin is oriented in the direction substantially parallel to the axial direction of said channel selection shaft, said casing being formed of an aperture at the position in alignment with the axis of said bobbin, whereby access to said intermediate frequency transformer is allowed from the outside of said casing for adjustment of the inductance value of said intermediate frequency transformer.

15 Claims, 13 Drawing Figures

VHF TELEVISION TUNER WITH EASY/FLEXIBLE ACCESS

BACKGROUND OF THE INVENTION

1. Field of the Invention

The present invention relates to an improvement in a very high frequency television tuner. More specifically, the present invention relates to an improvement in an adjusting scheme of an intermediate frequency transformer provided in a very high frequency tuner, particularly for use in a television receiver.

2. Description of the Prior Art

Of late, some types of very high frequency (hereinafter referred to as VHF) television receivers have been designed in accordance with the recent trend of miniturization and economy of materials. Such types of VHF television receivers often require that a VHF tuner be installed close to the inside of a cabinet of a television receiver or close to other circuit components. Typically, such a television tuner includes: a mechanical switching selection scheme of inductance coil means for selection of a broadcasting television signal; a radio frequency amplifier operatively coupled to said inductance coil means for selectively amplifying a desired radio frequency signal; a local oscillator operatively coupled to said inductance coil means for providing a local oscillation frequency signal, the frequency of which is different by a given frequency difference from said selectively amplified radio frequency signal; a mixer responsive to the selectively amplified radio frequency signal from the radio frequency amplifier and the local oscillation frequency signal from the local oscillator for providing an intermediate frequency signal; and an intermediate frequency tuned circuit for selectively withdrawing the said intermediate frequency signal.

The above mentioned mechanical switching selection scheme of inductance coil means may comprise a so-called turret type structure, i.e. a plurality of sets of coils, each set allotted for one channel, provided on a turret rotatably mounted so as to be rotated by means of a channel selection shaft, and a switching contact arrangement for selection of a desired set of coils as a function of manual rotation of the channel selection shaft. Alternatively, the above described mechanical switching selection scheme of inductance coil means may comprise a so-called switch type structure, i.e., a plurality of sets of coils, each set allotted for one channel, provided in a stationary manner along the periphery around a given axis, and a switching contact arrangement rotatably mounted about the axis so as to be rotated by means of a channel selection shaft.

Such a very high frequency television tuner for selection of a broadcasting television signal through mechanical switching selection of inductance coil means is usually mounted in a television receiver cabinet such that the end of a channel selection shaft comes outside the control panel of the cabinet and a channel selection knob is mounted to the end of the channel selection shaft for facility of manual rotation of the shaft. Thus, it would be appreciated that the position and orientation of the tuner installed in the television receiver cabinet are somewhat limitative.

On the other hand, the above described intermediate frequency tuned circuit typically comprises an intermediate frequency transformer and a capacitor connected across the transformer. As is well known to those skilled in the art, such an intermediate frequency transformer requires adjustment of the inductance value thereof. Typically, a conventional intermediate frequency transformer comprises an inductance coil wound on a bobbin which comprises a magnetic core threadably mounted in the bobbin for allowing to and fro movement of the magnetic core in the axial direction by rotating the magnetic core about the axis of the bobbin by means of a special purpose tool such as a screw driver, whereby adjustment of the inductance value of the intermediate frequency transformer is achieved by simply turning the magnetic core about the axis with a screw driver inserted into the bobbin so as to be engaged with the magnetic core and to adjustably position the core in the axial direction of the bobbin.

FIGS. 1 and 2 are illustrative of two examples of a simplified side view of a typical conventional VHF television tuner 1 for the purpose of showing the arrangement of the first stage intermediate frequency transformer 2 inside the television tuner 1. Typically, the turner 1 comprises a channel selection shaft 3 rotatably mounted and extending in the longitudinal direction of the tuner 1. Thus, the tuner 1 is usually positioned and oriented in the television receiver cabinet 4 such that the channel selection shaft 3 extends in the horizontal direction and the end of the shaft 3 comes outside of the cabinet 4 through an aperture 6, the end of the shaft 3 being then connected to a channel selection knob 5.

In such a conventional VHF television tuner, no consideration has been given to the orientation of the intermediate frequency transformer 2 from the standpoint of the adjustment of the inductance value of the transformer. More specifically, as seen in such a conventional VHF television tuner shown in FIGS. 1 and 2, the intermediate frequency transformer 2 has been oriented only from the standpoint of simplicity of structure for fixing the transformer to the tuner casing, such that the axis of the bobbin of the intermediate frequency transformer 2 extends in the vertical direction or substantially in the vertical direction when the tuner 1 is provided in the television receiver cabinet 4, most typically with the channel selection shaft 3 extending in the horizontal direction. The reason for this is presumably that the intermediate frequency transformer 2 is mounted simply by fixing, at a right angle or substantially at a right angle, the bobbin of the transformer to the circuit board or the tuner casing of the tuner which extends in the same direction as the channel selection shaft 3. Therefore, in such an orientation of the intermediate frequency transformer 2, it becomes difficult or impossible, as the case may be, to adjust the inductance value of the intermediate frequency transformer once the tuner is installed in the television receiver cabinet, adjustment being hindered by the cabinet wall or the other circuit components. Another problem encountered in a conventional VHF television tuner is that, since a tuner is installed in a television receiver cabinet after adjustment of various circuit components, including an intermediate frequency transformer, it could happen that these components will be brought to a misadjusted state because of an adverse affect of the cabinet upon these components, and the adjustment of these components is again difficult for the above described reason.

SUMMARY OF THE INVENTION

Briefly described, the present invention comprises a very high frequency television tuner for selection of a broadcasting television signal through mechanical switching selection of inductance coil means, comprising; a tuner casing; mechanical switching selection means provided in said casing and including a rotatably mounted channel selection shaft for selection of inductance means by rotation of said shaft; high frequency amplifying means operatively coupled to the selected inductance coil means for selectively amplifying a desired radio frequency signal; local oscillating means operatively coupled to said selected inductance coil means for providing a local oscillation frequency signal, the frequency of which is different by a given frequency difference from said selectively amplified radio frequency signal; mixing means responsive to said selectively amplified radio frequency signal from said radio frequency amplifying means and said local oscillation frequency signal from said local oscillating means for providing an intermediate frequency signal; and intermediate frequency tuned circuit means for selectively withdrawing said intermediate frequency signal, said intermediate frequency tuned circuit means comprising intermediate frequency transformer means, said intermediate frequency transformer means comprising intermediate frequency coil means having a given axis, and inductance adjusting means operatively coupled to said intermediate frequency coil means for adjusting the inductance value of said intermediate frequency coil means by rotation thereof about said axis of said intermediate frequency coil means, said intermediate frequency transformer means being provided in said casing such that the axis of said intermediate frequency coil means is oriented in the a direction substantially parallel to the direction of said selection shaft, said casing being formed of an aperture at the position in alignment with said axis of said intermediate frequency coil means for allowing access to said intermediate frequency coil means from the outside of said casing for adjustment of the inductance value of said intermediate frequency transformer means.

Preferably, said inductance coil means to be selected by said mechanical switching selection means comprises radio frequency inductance coil means to be coupled to said radio frequency amplifying means and oscillation inductance coil means, to be coupled to said local oscillating means and these radio frequency inductance coil means and local oscillation inductance coil means are positioned spaced apart in the axial direction of said mechanical switching selection means. More preferably, said radio frequency inductance coil means comprises preceding radio frequency inductance coil means and succeeding radio frequency inductance coil means, positioned spaced apart from each other in the axial direction of said mechanical switching selection means, with shield plate means provided therebetween and extending in the direction substantially perpendicular to the axial direction of said mechanical switching selection means, and said intermediate frequency transformer means being fixed to said shield plate means substantially perpendicularly thereto, whereby said intermediate frequency transformer means is oriented in a direction substantially parallel to the axis of said mechanical switching selection means. Alternatively, said intermediate frequency transformer means may be mounted, substantially at a right angle, to tab means formed substantially perpendicularly to a portion of the casing extending in a direction parallel to the axis of said mechanical switching selection means.

Therefore, a principal object of the present invention is to provide and improved adjusting scheme for adjusting the inductance value of an intermediate frequency transformer means provided in a VHF television tuner.

Another object of the present invention is to provide an arranged with improved orientation of an intermediate frequency transformer provided in a VHF television tuner.

A further object of the present invention is to provide an arrangement which allows access, from the outside of the casing of a VHF television tuner having a mechanical switching selection shaft, to an intermediate frequency transformer provided in said tuner in a direction substantially parallel to the axial direction of said mechanical switching selection shaft of the tuner.

These objects and other objects, features, aspects and advantages of the present invention will become more apparent from the following detailed description of the preferred embodiments of the present invention made in conjunction with the accompanying drawings.

DESCRIPTION OF THE PREFERRED EMBODIMENTS

Figure 1:
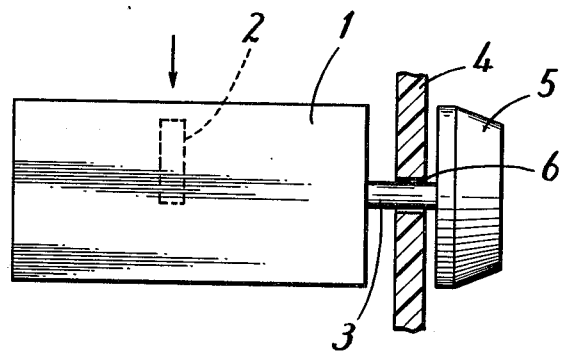
FIGS. 1 and 2 are illustrative of two examples of a simplified side view of a typical conventional VHF television tuner for the purpose of showing the arrangement of the first stage intermediate frequency transformer inside the television tuner.
Figure 2:
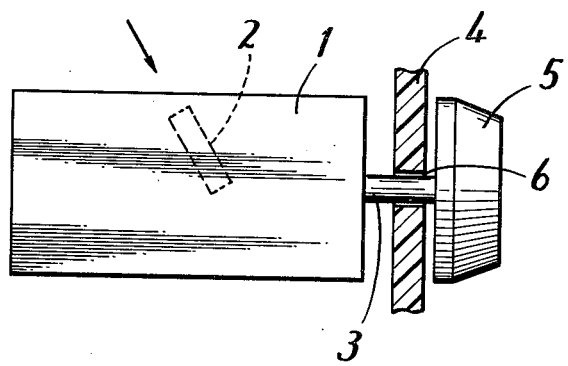
Figure 3:
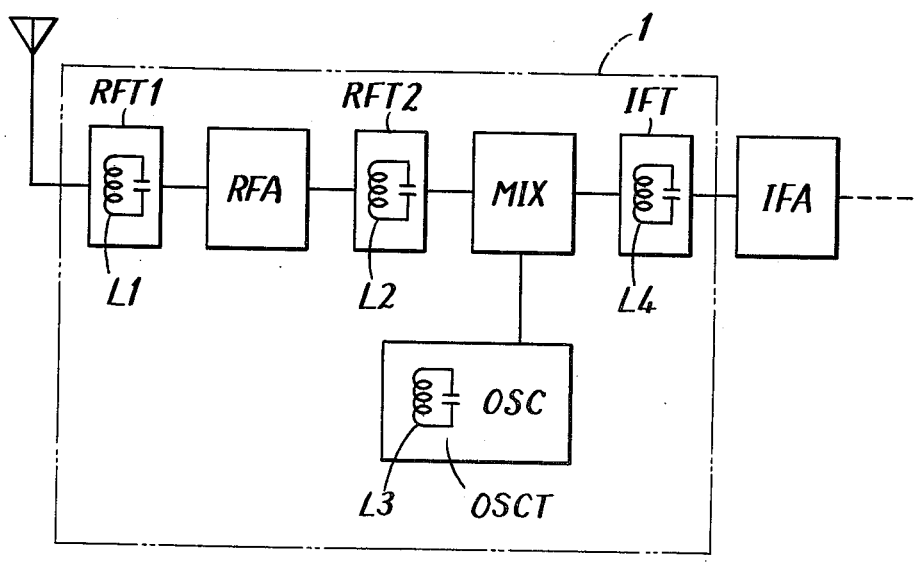
FIG. 3 is a block diagram of a typical very high frequency (or VHF) tuner, in which the present invention can be advantageously employed.

FIG. 3 is a block diagram of a typical very high frequency (or VHF) television tuner 1, in which the present invention can be advantageously employed. The tuner 1 is shown connected to an antenna ANT for receiving a broadcasting television wave, and comprises: a radio frequency amplifier RFA preceded and succeeded by a preceding stage radio frequency tuned circuit RFT1 and a succeeding stage radio frequency tuned circuit RFT2, respectively, for selectively amplifying the desired radio frequency signal; a local oscillator OSC for providing an oscillation frequency signal, the frequency of which is different by a given frequency difference from said selected radio frequency signal; a mixer responsive to said received radio frequency signal from the succeeding stage radio frequency tuned circuit RFT2 and said local oscillation frequency signal from said local oscillator OSC for providing an intermediate frequency signal; and an intermediate frequency tuned circuit IFT for selectively withdrawing said intermediate frequency signal, which is shown succeeded by an intermediate frequency amplifier IFA in a television receiver.

The radio frequency tuned circuits RFT1 and RFT2 each comprise inductance coils L1 and L2, respectively, which are to be selected for each channel by means of a mechanical switching selection means, such as described previously, and each are shunted by capacitors to form radio frequency tuned circuits. Similarly, the oscillator OSC also comprises an inductance coil L3, which is also selected for each channel by means of the mechanical switching selection means and is shunted by a capacitor to form an oscillator tuned circuit OSCT. Although the inductance values of the coils L1, L2, and L3 are changeable by means of the mechanical switching selection means, and hence the frequencies of the tuned circuits RFT1, RFT2 and OSCT are accordingly changeable for the purpose of selection of a desired channel, the difference between the frequencies of the radio frequency tuned circuits RFT1 and RFT2 and the oscillator tuned circuit OSCT being kept constant, so that a constant intermediate frequency signal may be obtained from the mixer MIX. Therefore, the intermediate frequency tuned circuit IFT is tuned to the predetermined intermediate frequency. The intermediate frequency tuned circuit IFT is in fact adjusted to the predetermined intermediate frequency in the course of assemblage of the television receivers in the factory. However, it is further desired that the intermediate frequency tuned circuit IFT be able to be adjusted (for example, by a serviceman) with ease at any time, even after the assemblage. The present invention is directed to an improvement in an adjusting scheme for adjusting the inductance value of the intermediate frequency tuned circuit IFT.

Figures 4A, 4B:
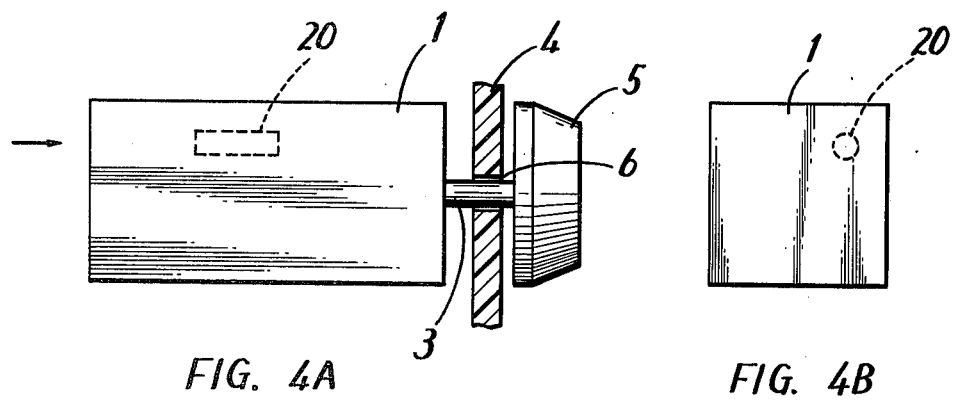
FIGS. 4A and 4B are simplified side and rear views, respectively, of the inventive VHF television tuner for the purpose of showing a general idea of the present invention.

FIGS. 4A and 4B are simplified side and rear views, respectively, of the inventive VHF television tuner for the purpose of showing a general idea of the present invention. The tuner 1 comprises a channel selection shaft 3 rotatably mounted extending in the longitudinal direction of the tuner 1. The tuner 1 is usually positioned, in the television cabinet 4 at the front panel thereof, with an orientation such that the channel selection shaft 3 extends in the horizontal direction and the end of the shaft 3 comes outside of the cabinet 4 through an aperture 6. The end of the shaft 3 is then provided with a channel selection knob 5 connected thereto. It is to be pointed out that the present invention is applicable to a VHF television tuner of either the turret type of rotary switch type.

According to the present invention, the intermediate frequency transformer 20 (denoted as L4 in FIG. 3) is oriented in a direction substantially parallel to the axial direction of the channel selection shaft 3 for the purpose of allowing access to the intermediate frequency transformer 20 in a direction substantially parallel to the axial direction of the channel selection shaft 3. As a result, the intermediate frequency transformer 20 of the tuner 1 can be adjusted as to its inductive value in a direction substantially parallel to the axial direction of the channel selection shaft 3 even after installation of the tuner 1 in the television receiver cabinet 4, and from the outside of the cabinet through an aperture formed at a position in alignment with the axis of the intermediate frequency transformer, to be more fully described. In this context, it should be appreciated that the axis of the intermediate frequency transformer may not necessarily be in a direction strictly parallel to the axial direction of the channel selection shaft 3, but instead may be in a direction only substantially parallel to the axial direction of the channel selection shaft 3. For example, the axial direction of the intermediate transformer 20 may be slightly oblique with respect to the axial direction of the channel selection shaft 3, say at an angle less than 15°° with respect to the axial direction of the channel selection shaft 3.

Figure 5:
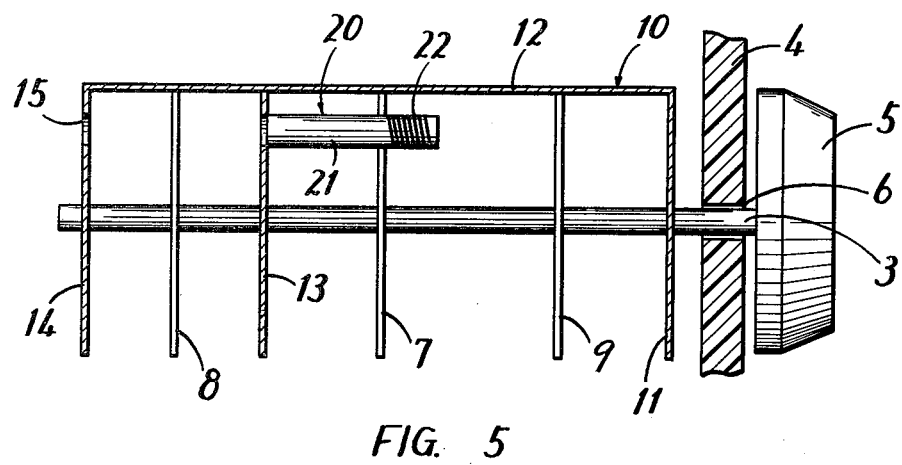
FIG. 5 is a simplified sectional view of one embodiment of the present invention, as embodied in a switch type VHF television tuner.

FIG. 5 is a simplified sectional view of one embodiment of the present invention, as embodied in a switch type VHF television tuner. Referring to FIG. 5, a casing 10 of the tuner 1 comprises a top plate 12 and front and rear end plates 11 and 14, which are penetrated by the channel selection shaft 3 rotatably mounted at the end plates 11 and 14. The tuner 1 further comprises front, middle and rear insulation plates 9, 7 and 8, provided spaced apart from each other in the axial direction of the channel selection shaft 3, each of the plates 9, 7 and 8 extending from the top plate 12, while these plates 9, 7 and 8 are also penetrated by the channel selection shaft 3. The plate 9 is allotted for arrangement of various components of the oscillator OSC in FIG. 3 and hence comprises a plurality of coil elements arranged along the circle, which coil elements are operatively coupled to a switching scheme (not shown) and are switch-operable by rotation of the channel selection shaft 3 for selection of a desired inductance value, as well as other circuit components, for the oscillator OSC. The plate 7 is provided for arrangement thereon of the various components of the succeeding radio frequency tuned circuit RFT2 in FIG. 3, and hence comprises a plurality of coil elements for the radio frequency tuned circuit RFT2, arranged in the form of a circle, which coil elements are operatively coupled to the switching scheme (not shown) and are switch-operable by rotation of the channel selection shaft 3 for selection of a desired inductance value, as well as other circuit components, for the radio frequency tuned circuit RFT2. The plate 8 is provided for arrangement thereon of various components of the radio frequency tuned circuit RFT1 and hence, comprises a plurality of coil elements for the high frequency tuned circuit RFT1 arranged in the form of a circle, which coil elements are operatively coupled to the switching scheme (not shown) and are switch-operable by rotation of the channel selection shaft 3 for selection of a desired inductance value, as well as the remaining circuit components, for the radio frequency amplifier HFA.

A shield plate 13 is provided extending from the top plate 12 of the casing 10 in a direction perpendicular to the axial direction of the channel selection shaft 3 so that the plate 13 is also penetrated by the channel selection shaft 3 at a position intermediate the said plates 7 and 8. According to this embodiment of the present invention, a bobbin 21, on which is wound the coil 22 of the intermediate frequency transformer 20, is fixed at a right angle to the shield plate 13. Hence, the inventive intermediate frequency transformer 20 extends in a direction substantially parallel to the axial direction of the channel selection shaft 3. According to the present invention, the end plate 14 has an aperture 15 formed therein at a position in alignment with the axis of the bobbin 21 of the intermediate frequency transformer 20. It should be appreciated that, according to the present invention, the orientation of the intermediate frequency transformer 20 and the formation of an adjusting aperture 15 make it possible for one to have access to the intermediate frequency transformer from the rear side of the television receiver cabinet, even after assemblage of the television receiver. Hence, one can adjust the inductance value of the intermediate frequency transformer, as desired, by rotating the core of the intermediate frequency transformer by the use of a screw driver to be inserted through the adjusting aperture 15 toward the intermediate frequency transformer 20.

Figure 6:
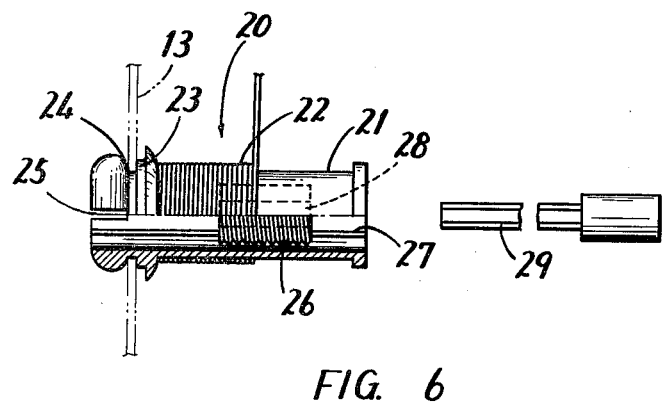
FIG. 6 shows only a side view, partially in section, of an intermediate frequency transformer, and of a structure for fixing the same to a shield plate.

FIG. 6 shows only a side view, partially in section, of an intermediate frequency transformer 20 and a structure for fixing the same to the shield plate 13. The intermediate frequency transformer 20 comprises a coil 22 wound on a cylindrical bobbin 21 made of plastic, the base portion 31 of which is split as at 25 into two portions so as to provide elasticity, and therein is formed an annular groove 24, adjacent to which a flange 23 is formed. The shield plate 13 is provided with an aperture 30, the diameter of which is substantially the same as the diameter of the groove 24 of the bobbin 21. Thus, the bobbin 21 can be fixed to the shield plate 13 by simply inserting the base portion 31 of the bobbin 21 into the aperture of the shield plate 13 by taking advantage of the elasticity of the split portions of the base portion 31 of the bobbin 21 so that the edge of the aperture 30 formed in the shield plate 13 fits into the groove 24. The bobbin 21 is formed of a few protuberances 27 on the inside wall surface of the bobbin 21 extending in the axial direction of the bobbin 21. The inner wall surface of the bobbin 21 is threaded at the protuberances 27 so that a threaded cylindrical magnetic core 26 may be threadably inserted into the bobbin 21. The magnetic core 26 has a hexagonal hole 28 formed therethrough in the axial direction thereof so that the tip end of a similar hexagonal screw driver 29 may be inserted. Thus, rotation of the magnetic core 26 about the axis of the bobbin 21 by the use of the screw driver 28 causes to and fro movement of the magnetic core 26 in the axial direction of the bobbin 21.

Figure 7:
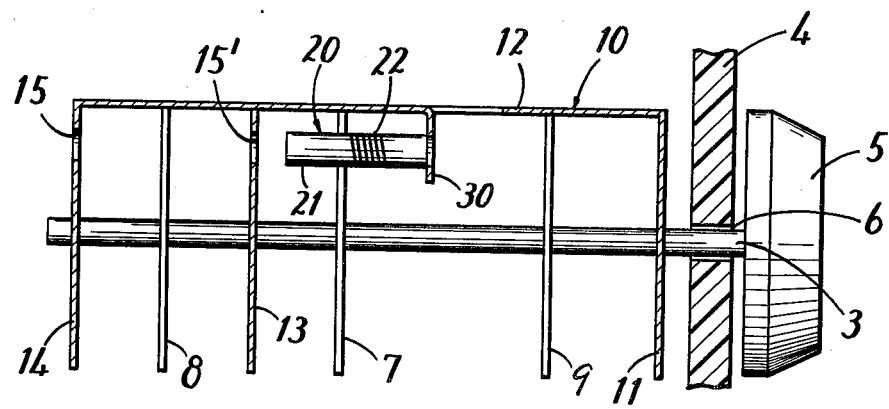
FIG. 7 is similar to FIG. 5 but shows a simplified sectional view of another embodiment of the present invention.

FIG. 7 is similar to FIG. 5 but shows a simplified sectional view of another embodiment of the present invention. Referring to FIG. 7, the top plate 12 of the casing 10 is cut into a tongue portion 30 which is then bent at a right angle to extend from the top plate 12 in a direction perpendicular to the axis of the channel selection shaft 3. According to the embodiment shown, the intermediate frequency transformer 20 is fixed to the said tongue portion 30 in a direction substantially parallel to the axial direction of the channel selection shaft 3. The rear end plate 14 and the shield plate 13 are provided with adjusting apertures 15 and 15', respectively, at positions in alignment with the axial direction of the bobbin 21. Since the structure of other portions of the embodiment shown is the same as that of the FIG. 5 embodiment, the same portions are denoted by the same reference numerals. Hence, it is not believed necessary to describe in any more detail the structure of the other portions.

Figure 8:
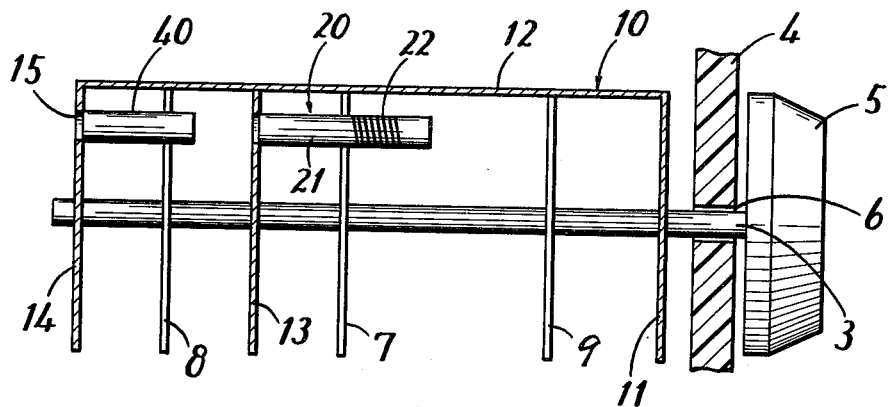
FIG. 8 is also similar to FIG. 5 but shows a simplified sectional view of a further embodiment of the present invention.

FIG. 8 is also similar to FIG. 5 but shows a simplified sectional view of a further embodiment of the present invention. Referring to FIG. 8 in comparison with FIG. 5, a cylindrical guide 40 is provided in addition to the other elements of the FIG. 5 embodiment. More specifically, the cylindrical guide 40 may be made of plastic and may be fixed to the edge of the adjusting aperture 15 of the end plate 14 so as to extend in alignment with the bobbin 21 of the transformer 20 in the same manner as described with reference to FIG. 5 in conjunction with the bobbin 21 of the intermediate frequency transformer 20. Thus, the bobbin 21 for the intermediate frequency transformer 20 may be used as a cylindrical guide 40. In view of the fact that the intermediate frequency transformer 20 is located remotely from the outside the casing 10 of the tuner, provision of the cylindrical guide 40 facilitate insertion of a screw driver 28 toward the center of the bobbin 21 of the intermediate frequency transformer 20.

Figure 9:
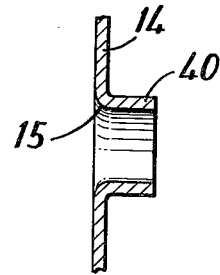
FIG. 9 is a sectional view of a portion of the end plate in the vicinity of the adjusting aperture for showing another embodiment of a cylindrical guide.

FIG. 9 is a sectional view of a portion of the end plate 14 in the vicinity of the adjusting aperture 15 for showing another embodiment of a cylindrical guide 40. According to the embodiment shown, the cylindrical guide 40 is formed integrally with the end plate 14 by a well known plate work process. By way of another embodiment of the cylindrical guide 40 the base portion of the bobbin 21 may be extended toward the adjusting aperture 15 of the end plate 14 to form a similar guide portion.

Figure 10:
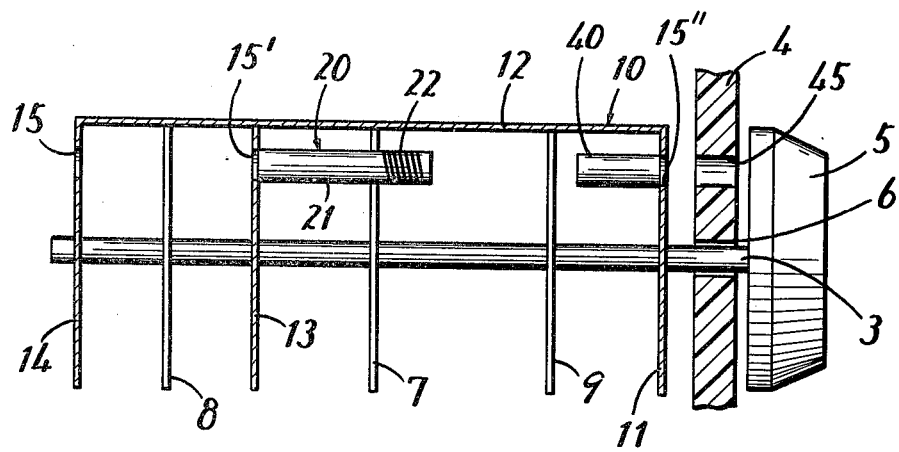
FIG. 10 is again similar to FIG. 5 but shows a simplified sectional view of still a further embodiment of the present invention.

FIG. 10 is again similar to FIG. 5 but shows a simplified sectional view of still a further embodiment of the present invention. Referring to FIG. 10, the front plate 11 rather than the end plate 14 is provided with an adjusting aperture 15" at a position in alignment with the axis of the intermediate frequency transformer 20 and a cylindrical guide 40 is fixed to the adjusting aperture 15" of the front plate 11 so as to extend backward, whereby access to the intermediate frequency transformer 20 is possible from the outside of the front plate 11 of the casing 10 of the tuner. As previously described, usually the tuner is provided in a television receiver cabinet 4 so that the end of the channel selection shaft 3 comes out from the cabinet through an aperture 6. According to the embodiment shown, the television receiver cabinet 4 is further provided with an adjusting aperture 45 at a position in alignment with the adjusting aperture 15" of the front plate and the intermediate frequency transformer 20. Preferably, such an adjusting aperture 45 may be located within the diameter of a channel selection knob 5, so that the adjusting aperture 45 may be concealed by the knob 5 when the knob 5 is fixed to the end of the channel selection shaft 3. Hence, if it is desired to readjust the inductance value of the intermediate frequency transformer 20 after the tuner 1 is installed in the television receiver cabinet 4, one can have access to the intermediate frequency transformer 20 by the use of an elongated tool like a screw driver after the channel selection knob 5 is simply removed from the end of the channel selection shaft 3. It is pointed out that provision of the cylindrical guide 40 is not necessarily required and hence can be dispensed with, although it is much preferred for the purpose described previously.

Figure 11:
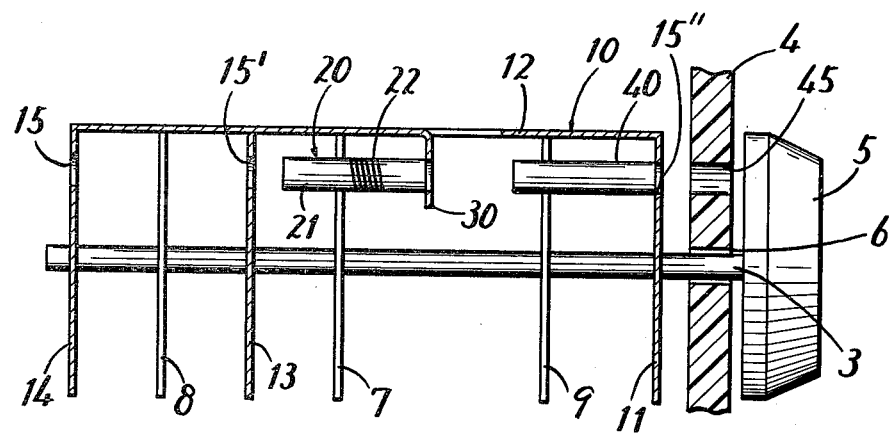
FIG. 11 is similar to FIG. 7 but shows a simplified sectional view of still a further embodiment of the present invention.

FIG. 11 is similar to FIGS. 7 and 10 but shows a simplified sectional view of still a further embodiment of the present invention. Referring to FIG. 11 in comparison with FIGS. 7 and 10, an adjusting aperture 15" is formed in the front plate 11 rather than in the rear plate 14 and the shield plate 13 at a position in alignment with the axis of the intermediate frequency transformer 20 for the purpose of providing accessibility from the outside of the front plate 11 of the casing 10 of the tuner 1, as discussed in conjunction with the FIG. 10 embodiment, and a cylindrical guide 40 is also provided. Since the structure of other portions is the same as that of the FIGS. 7 and 10 embodiments, the same portions have been denoted by the same reference numerals. Hence, it is not believed necessary to describe in more detail the structure of other portions. It is pointed out that provision of the cylindrical guide 40 can be dispensed with for simplicity.

Figure 12:
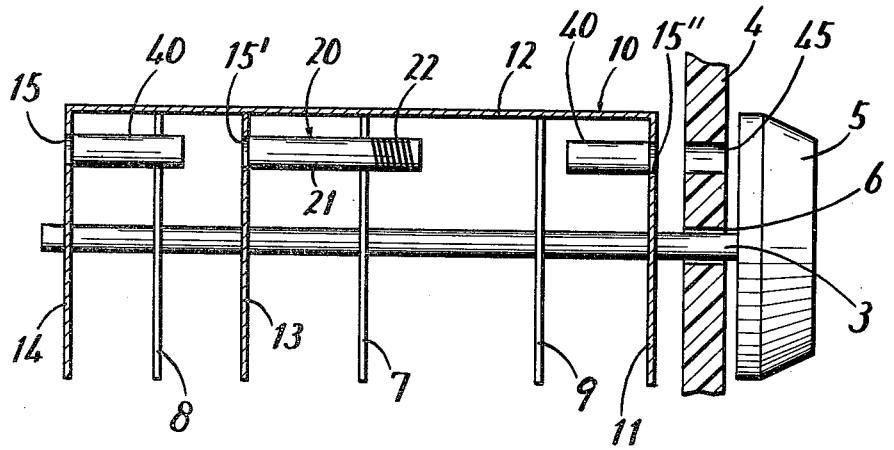
FIG. 12 is similar to both FIGS. 8 and 10 but shows a simplified sectional view of still a further embodiment of the present invention.

FIG. 12 is similar to both FIGS. 8 and 10 but shows a simplified sectional view of a still further embodiment of the present invention. Referring to FIG. 12, the embodiment shown comprises a combination of the features in both the FIGS. 8 and 10 embodiments for the purpose of providing accessibility from the outside through both the front and rear plates 11 and 14. Hence, the same portions as those in FIGS. 8 and 10 have been denoted by the same reference numerals. Therefore, it is not believed necessary to describe the structure in more detail. It is appreciated that the embodiment shown enables adjustment of the inductance value of the intermediate frequency transformer 20 both from outside of the control panel of the television receiver cabinet or from outside of the rear surface of the television receiver cabinet, even after the tuner 1 is installed in the television receiver cabinet. Hence, adjustment of the intermediate frequency transformer 20 of the tuner is much more facilitated according to the embodiment shown. It is pointed out that either or both of cylindrical guides 40 fixed to the front and rear plates 11 and 14 can be dispensed with for the reason discussed previously. It is further pointed out that the intermediate frequency transformer may be mounted on the tongue portion 30 described in conjunction with the FIGS. 7 and 11 embodiments rather than to the shield plate 13.

Although this invention has been described and illustrated in detail, it is to be clearly understood that the same is by way of illustration and example only and is not to be taken by way of limitation, the spirit and scope of this invention being limited only by the terms of the appended claims.

What is claimed is:

1. A VHF television tuner for selection of a television signal through mechanical switching selection of a radio frequency inductance coil and a corresponding oscillation frequency inductance coil, comprising a tuner casing, mechanical switching selection means provided in said casing and including a rotatably mounted channel selection shaft having a given axis of rotation, said mechanical switching selection means being responsive to operator selection of a desired radio frequency signal for selecting corresponding said radio frequency inductance coil and corresponding said oscillation frequency inductance coil by rotation of said shaft, radio frequency amplifying means operatively coupled to the selected radio frequency inductance coil for selectively amplifying said desired radio frequency signal, local oscillating means operatively coupled to said selected oscillation frequency inductance coil for providing a local oscillation frequency signal having a frequency which is different by a given frequency difference from said desired radio frequency, mixing means responsive to said selectively amplified radio frequency signal from said radio frequency amplifying means and said local oscillation frequency signal from said local oscillating means for providing an intermediate frequency signal, and intermediate frequency tuned circuit means for selectively withdrawing said intermediate frequency signal for broadcast, said intermediate frequency tuned circuit means comprising an intermediate frequency transformer comprising an intermediate frequency coil having a given axis and inductance value, and adjusting means operatively coupled to said intermediate frequency coil for adjusting the inductance value of said intermediate frequency coil by rotation thereof about said axis of said intermediate frequency coil, said intermediate frequency transformer being provided in said casing such that the axis of said intermediate frequency coil is oriented in a direction substantially parallel to the given axis of rotation of said channel selection shaft, wherein said intermediate frequency coil comprises a bobbin and a coil wound around said bobbin, and said adjusting means comprises a magnetic core threadably mounted in said bobbin for allowing thereof about said given axis so as to cause to and fro movement of said magnetic core in the axial direction of said given axis of said intermediate frequency coil, wherein said tuner casing has a front end and a rear end, said adjusting means being adapted to be accessible from at least one of the front and rear ends of the tuner, said casing being discontinuous so as to define an aperture at said at least one of the front and rear ends thereof at a position in alignment with said given axis of said intermediate frequency coil for allowing access to said intermediate frequency transformer from outside of said at least one of the front and rear ends of said casing for adjustment of the inductance value of said intermediate frequency coil, said tuner further comprising a plate member provided extending in a direction substantially perpendicular to the direction of said given axis of said channel selection shaft, and wherein said intermediate frequency transformer is mounted on said plate member.

2. A VHF television tuner in accordance with claim 1, wherein said radio frequency amplifying means has an input comprising a preceding stage thereof and an output comprising a succeeding stage thereof, and said radio frequency inductance coil comprises a preceding radio frequency inductance coil operatively coupled to said radio frequency amplifying means at the preceding stage thereof, and a succeeding stage radio frequency inductance coil operatively coupled to said radio frequency amplifying means at the succeeding stage thereof, said preceding stage radio frequency inductance coil and said succeeding stage radio frequency inductance coil being spaced apart from each other in the direction of said given axis of said channel selection shaft.

3. A VHF tuner in accordance with claim 2, which further comprises a shield plate provided intermediate between said preceding stage radio frequency inductance coil and said succeeding stage radio frequency inductance coil.

4. A VHF television tuner in accordance with claim 3, wherein said intermediate frequency transformer is mounted on said shield plate.

5. A VHF television tuner in accordance with claim 2, wherein said succeeding stage radio frequency inductance coil is provided in the vicinity of said intermediate frequency transformer.

6. A VHF television tuner in accordance with claim 1, which further comprises guiding means for guiding operator access to said intermediate frequency transformer.

7. A VHF television tuner in accordance with claim 6, wherein said guiding means comprises a cylindrical member mounted on said tuner casing in alignment with the axis of said intermediate frequency coil.

8. A VHF television tuner in accordance with claim 1, which is installed in a television receiver cabinet, wherein said television receiver cabinet is discontinuous so as to form an aperture means in alignment with the given axis of said intermediate frequency coil for providing operator access to said intermediate frequency coil and said adjusting means for adjusting the inductance value of said intermediate frequency coil.

9. A VHF television tuner in accordance with claim 1, which is installed in a television receiver cabinet, wherein said television receiver cabinet is discontinuous so as to form an aperture in alignment with the given axis of said intermediate frequency coil.

10. A tuner for selective reception of a signal of a desired radio frequency selected by an operator, comprising:
a tuner casing having a front face and a rear face defining a casing axis therebetween,
means responsive to operator selection of said desired radio frequency for selecting said signal of said desired radio frequency and for producing an intermediate frequency signal corresponding thereto, and
intermediate frequency tuned circuit means for processing said intermediate frequency signal in accordance with a preset inductance value; said intermediate frequency tuned circuit means comprising:
an intermediate frequency coil, having a variable inductance value and a coil axis, and
adjusting means responsive to operator adjustment action for adjusting said variable inductance value to said preset inductance value,
said intermediate frequency coil being mounted in said casing such that said coil axis is oriented in a direction substantially parallel to said casing axis, wherein said tuner casing has a front end and a rear end, said adjusting means being adapted to be accessible from at least one of the front and rear ends of the tuner, said casing being discontinuous so as to define an aperture at said at least one of the front and rear ends thereof at a position in alignment with said coil axis of said intermediate frequency coil for allowing access to said intermediate frequency coil from outside of said at least one of the front and rear ends of said casing for adjustment of the variable inductance value of said intermediate frequency coil,
wherein said tuner additionally comprises a plate member mounted on said tuner casing and extending in a direction substantially perpendicular to said coil axis, said intermediate frequency coil being mounted on said plate member.

11. A tuner in accordance with claim 10, wherein said intermediate frequency coil comprises a bobbin and a coil wound around said bobbin, and said adjusting means comprises a magnetic core threadably mounted in said bobbin for allowing rotation thereof about said coil axis so as to cause movement generally along said coil axis, whereby to adjust said variable inductance value.

12. A tuner in accordance with claim 10, wherein said tuner further comprises guiding means disposed along said coil axis for guiding operator access to said intermediate frequency coil.

13. A tuner in accordance with claim 10, wherein said selecting means comprises:
a preceding stage radio frequency inductance coil mounted on said tuner casing along said casing axis for providing a first radio frequency signal,
a succeeding stage radio frequency inductance coil mounted on said tuner casing along said casing axis and spaced from said preceding stage radio frequency inductance coil, and responsive to said first radio frequency signal for producing a corresponding second radio frequency signal,
a local oscillator for generating a local oscillation frequency signal, and
means for mixing said second radio frequency signal with said local oscillation frequency signal to provide said intermediate frequency signal.

14. A tuner in accordance with claim 13, wherein said plate member is mounted on said tuner casing intermediate between said preceding stage radio frequency inductance coil and said succeeding stage radio frequency inductance coil.

15. A tuner in accordance with claim 10, wherein said tuner further comprises guiding means disposed along said coil axis for guiding operator access to said intermediate frequency coil, and wherein said guiding means comprises a cylindrical member mounted on said tuner casing in alignment with said coil access.

* * * * *

UNITED STATES PATENT AND TRADEMARK OFFICE
CERTIFICATE OF CORRECTION

PATENT NO. : 4,157,504
DATED : June 5, 1979
INVENTOR(S) : Katsuo Ito et al

It is certified that error appears in the above-identified patent and that said Letters Patent are hereby corrected as shown below:

Column 3, line 36, delete "the".
Column 4, line 5, "and" should be --an--.
Column 4, line 9, "arranged" should be --arrangement--.
Column 5, line 64, "of" (second occurrence) should be --or--.
Column 6, line 21, "15°°" should be --15°--.
Column 10, line 29, after "allowing" insert --rotation--.

Signed and Sealed this

Twenty-third Day of October 1979

[SEAL]

Attest:

RUTH C. MASON
Attesting Officer

LUTRELLE F. PARKER
Acting Commissioner of Patents and Trademarks